(12) United States Patent
Cucchetti et al.

(10) Patent No.: US 6,403,972 B1
(45) Date of Patent: Jun. 11, 2002

(54) METHODS AND APPARATUS FOR ALIGNMENT OF ION BEAM SYSTEMS USING BEAM CURRENT SENSORS

(75) Inventors: Antonella Cucchetti, Beverly; Leo Vincent Klos, Jr., Newburyport; Joseph C. Olson; Raymond L. Pelletier, both of Beverly; Keith Pierce, Ipswich; Anthony Renau, West Newbury; Donna Smatlak, Belmont, all of MA (US)

(73) Assignee: Varian Semiconductor Equipment Associates, Inc., Gloucester, MA (US)

(*) Notice: Subject to any disclaimer, the term of this patent is extended or adjusted under 35 U.S.C. 154(b) by 0 days.

(21) Appl. No.: 09/349,828

(22) Filed: Jul. 8, 1999

(51) Int. Cl.[7] ................ H01J 37/30; H01J 37/304
(52) U.S. Cl. .................. 250/492.21; 250/398
(58) Field of Search .................. 250/492.21, 398

(56) References Cited

U.S. PATENT DOCUMENTS

| | | | |
|---|---|---|---|
| 4,751,393 A | | 6/1988 | Corey, Jr. et al. ....... 250/492.21 |
| 4,922,106 A | | 5/1990 | Berrian et al. ......... 250/492.21 |
| 4,980,562 A | * | 12/1990 | Berrian et al. ......... 250/492.21 |
| 5,629,528 A | | 5/1997 | Jost et al. ............. 250/492.21 |
| 5,757,018 A | | 5/1998 | Mack et al. ........... 250/492.21 |
| 6,020,592 A | * | 2/2000 | Liebert et al. ......... 250/492.21 |
| 6,160,262 A | * | 12/2000 | Aoki ..................... 250/398 |
| 6,194,734 B1 | * | 2/2001 | Loomis et al. ......... 250/492.21 |

OTHER PUBLICATIONS

A. Renau et al, "The VIISta 810 300mm Med. Current Ion Implanter", XIIth Int'l Conf. On Ion Implantation Technology, Jun. 22–26, 1988, Kyoto, Japan, 4 pages.

A. Renau, "The Beam Line Arch. Of the VIISta 810 Medium Current Ion Implanter", XIIth Int'.l Conf. On Ion Implantation Technology, Jun. 22–26, 1988, Kyoto, Japan, 4 pages.

A. Cucchetti et al., "Diagnostics and Modeling in the Development of the VIISta 810 Ion Implanter", XIIth Int'l Conf. On Ion Implantation Technology, Jun, 22, 26, Kyoto, Japan, 4 pages. (1988).

J.C. Olson et al, "Scanned Beam Uniformity Control in the VIISta 810 Ion Implanter", XIIth Int'l. Conf. On Ion Implantation Technology, Jun. 22, 26, Koyto, Japan, 4 pages. (1988).

* cited by examiner

Primary Examiner—Bruce Anderson
(74) Attorney, Agent, or Firm—Wolf, Greenfield & Sacks, P.C.

(57) ABSTRACT

An ion beam is sensed with a beam current sensor which has a sensing aperture that is smaller than a cross-sectional dimension of the ion beam at the beam current sensor. The sensed ion beam current is indicative of ion beam position relative to a desired ion beam path. The ion beam position may be adjusted if the sensed ion beam position differs from the desired ion beam path. One or more beam current sensors may be utilized in an ion implanter for calibration and/or alignment. The beam current sensor may be utilized to determine a relation between a characteristic of an ion beam, such as magnetic rigidity, and a parameter of a system element, such as magnetic field, required to direct the ion beam along a desired ion beam path.

34 Claims, 7 Drawing Sheets

METHODS AND APPARATUS FOR ALIGNMENT OF ION BEAM SYSTEMS USING BEAM CURRENT SENSORS

FIELD OF THE INVENTION

This invention relates to systems for ion implantation of semiconductor wafers and, more particularly, to methods and apparatus for alignment and calibration of ion beam systems using Faraday beam current sensors with small sensing apertures.

BACKGROUND OF THE INVENTION

Ion implantation has become a standard technique for introducing conductivity-altering impurities into semiconductor wafers. A desired impurity material is ionized in an ion source, the ions are accelerated to form an ion beam of prescribed energy, and the ion beam is directed at the surface of the wafer. The energetic ions in the beam penetrate into the bulk of the semiconductor material and are embedded in the crystalline lattice of the semiconductor material to form a region of desired conductivity.

Ion implantation systems usually include an ion source for converting a gas or a solid material into a well-defined ion beam. The ion beam is mass analyzed to eliminate undesired ion species, is accelerated to a desired energy and is directed onto a target plane. The beam is distributed over the target area by beam scanning, by target movement or by a combination of beam scanning and target movement.

Ion implanters typically include components that deflect the ion beam using magnetic fields or electrostatic fields. For example, the ion implanter may include a mass analyzer which deflects different ion species in the ion beam by different amounts. In addition, the ion implanter may include an electrostatic or magnetic scanner for deflecting the ion beam over the surface of the wafer being implanted. Furthermore, ion implanters commonly include angle correction magnets that convert a scanned ion beam with diverging ion trajectories into an ion beam with parallel ion trajectories. A typical ion implanter includes several components that deflect the ion beam as described above. The beam deflections must be carefully controlled in order to ensure uniform and efficient implantation of the target wafer. Deviations of the ion beam from the desired path to the target may result in sputtering of beamline components, target contamination and reduced beam current delivered to the target.

It will be understood that inaccuracies and variations in the magnetic and/or electric fields used to deflect the ion beam result in deviations of the ion beam from the desired beam path. The deflection of an ion beam passing through a magnetic field is a function of the magnetic field strength, the distance over which the magnetic field is applied, the ionic mass, the ionic charge and the beam energy. Thus, differences in magnet geometry and magnetic field may cause the ion beam to deviate from the desired ion beam path. Furthermore, it is customary to utilize the ion implanter to implant ions of different species, different energies and different charge states. When the parameters of the ion beam, such as ion species, ion energy and the like, are changed, it is necessary to adjust the magnetic and/or electric fields to ensure that the ion beam follows the desired ion beam path. Where the ion implanter has several beam deflection components, the alignment of the ion beam can be difficult and time consuming. In addition, realignment is necessary each time the beam parameters are changed. In view of the foregoing, there is a need for improved methods and apparatus for alignment and calibration of ion implanters.

A beam current sensor in the form of a Faraday cup, or Faraday current detector, is typically used to measure ion current in an ion implanter. A Faraday cup includes an electrode mounted in a conductive enclosure and electrically isolated from ground. An ion current entering the enclosure produces an electrical current in a lead connected to the electrode. The electrical current is representative of the ion current.

U.S. Pat. No. 4,922,106 issued May 1, 1990 to Berrian et al discloses the use of a translating Faraday current detector to determine dose uniformity over the area of the wafer. U.S. Pat. No. 4,751,393 issued Jun. 14, 1988 to Corey, Jr. et al discloses the use of multiple Faraday cups disposed around the periphery of the wafer to determine dose uniformity.

SUMMARY OF THE INVENTION

According to a first aspect of the invention, a method for sensing an ion beam is provided. The method comprises the steps of generating an ion beam and directing the ion beam along a beamline, and sensing the ion beam with a beam current sensor positioned on or adjacent to the beamline. The beam current sensor has a sensing aperture that is smaller than the cross-sectional dimension of the ion beam at the current sensor, wherein the sensed ion beam current is indicative of ion beam position relative to a desired ion beam path.

The method may further include the step of adjusting the ion beam position if the sensed ion beam position differs from the desired ion beam path. Where the beam current sensor is positioned on the desired ion beam path, the ion beam position may be adjusted for maximum sensed ion beam current. The ion beam position may be adjusted by adjusting a magnetic field or an electric field applied to the ion beam, or by adjusting the position of an electrode or other component that affects ion beam position.

According to another aspect of the invention, the ion beam may be sensed with a plurality of beam current sensors located at different positions on or adjacent to the beamline. Each of the beam current sensors has a sensing aperture that is smaller than the cross-sectional dimension of the ion beam at the respective current sensor, wherein the ion beam current sensed by each of the beam current sensors is indicative of ion beam position relative to a desired ion beam path.

According to another aspect of the invention, a method is provided for calibrating a system element in an ion beam system, wherein the system element changes the position of an ion beam with respect to an ion beam path depending on a parameter Y of the system element and a characteristic X of the ion beam. The method comprises the steps of positioning a beam current sensor on or adjacent to the ion beam path, and, using the beam current sensor, determining a relation $Y=f(X)$ between the characteristic X of the ion beam and the parameter Y of the system element that is required to direct the ion beam along the ion beam path. The beam current sensor has a sensing aperture that is smaller than a cross-sectional dimension of the ion beam at the beam current sensor.

For a magnetic system element, the characteristic X comprises the magnetic rigidity of the ion beam, and the parameter Y comprises the magnetic field produced by the system element. For an electrostatic system element, the characteristic X comprises the energy and the charge state of the ion beam, and the parameter Y comprises the electric field produced by the system element.

The relation $Y=f(X)$ may be determined by measuring two or more sets of values of the characteristic X and the parameter Y required to direct the ion beam along the ion beam path. For a beam of characteristic X, the parameter Y is adjusted for maximum sensed beam current. The relation Y=f(X) can then be utilized to set the parameter Y so as to direct an ion beam of characteristic X along the ion beam path.

In a more specific case, a method is provided for determining a relation between magnetic rigidity R of an ion beam and magnetic field B required to direct the ion beam along a desired path in an ion beam apparatus. The method comprises the steps of positioning a beam current sensor on or adjacent to the desired path, using the beam current sensor to determine a first magnetic field $B_1$ required to direct a first ion beam having a first magnetic rigidity $R_1$ along the desired path, and using the beam current sensor to determine a second magnetic field $B_2$ required to direct a second ion beam having a second magnetic rigidity $R_2$ along the desired path. From the values of $B_1$, $B_2$, $R_1$ and $R_2$, values of $a_0$ and $a_1$ in the equation $B=a_1 R+a_0$ are calculated, thereby providing a relation between magnetic rigidity R of an ion beam and magnetic field B for the ion beam apparatus.

According to yet another aspect of the invention, an ion implanter is provided. The ion implanter comprises an ion source for generating an ion beam and for directing the ion beam along a beamline toward a target position, an ion beam deflection element disposed along the beamline for deflecting the ion beam relative to the beamline, and a beam current sensor positioned on or adjacent to the beamline for sensing ion beam current. The beam current sensor has a sensing aperture that is smaller than the cross-sectional dimension of the ion beam at the current sensor, wherein the sensed ion beam current is indicative of ion beam position relative to a desired ion beam path. The ion implanter further comprises means for adjusting the ion beam deflection element, in response to the sensed ion beam position, so that the ion beam is directed along the desired ion beam path.

BRIEF DESCRIPTION OF THE DRAWINGS

For a better understanding of the present invention, reference is made to the accompanying drawings, which are incorporated herein by reference and in which.

DETAILED DESCRIPTION

Figure 1:
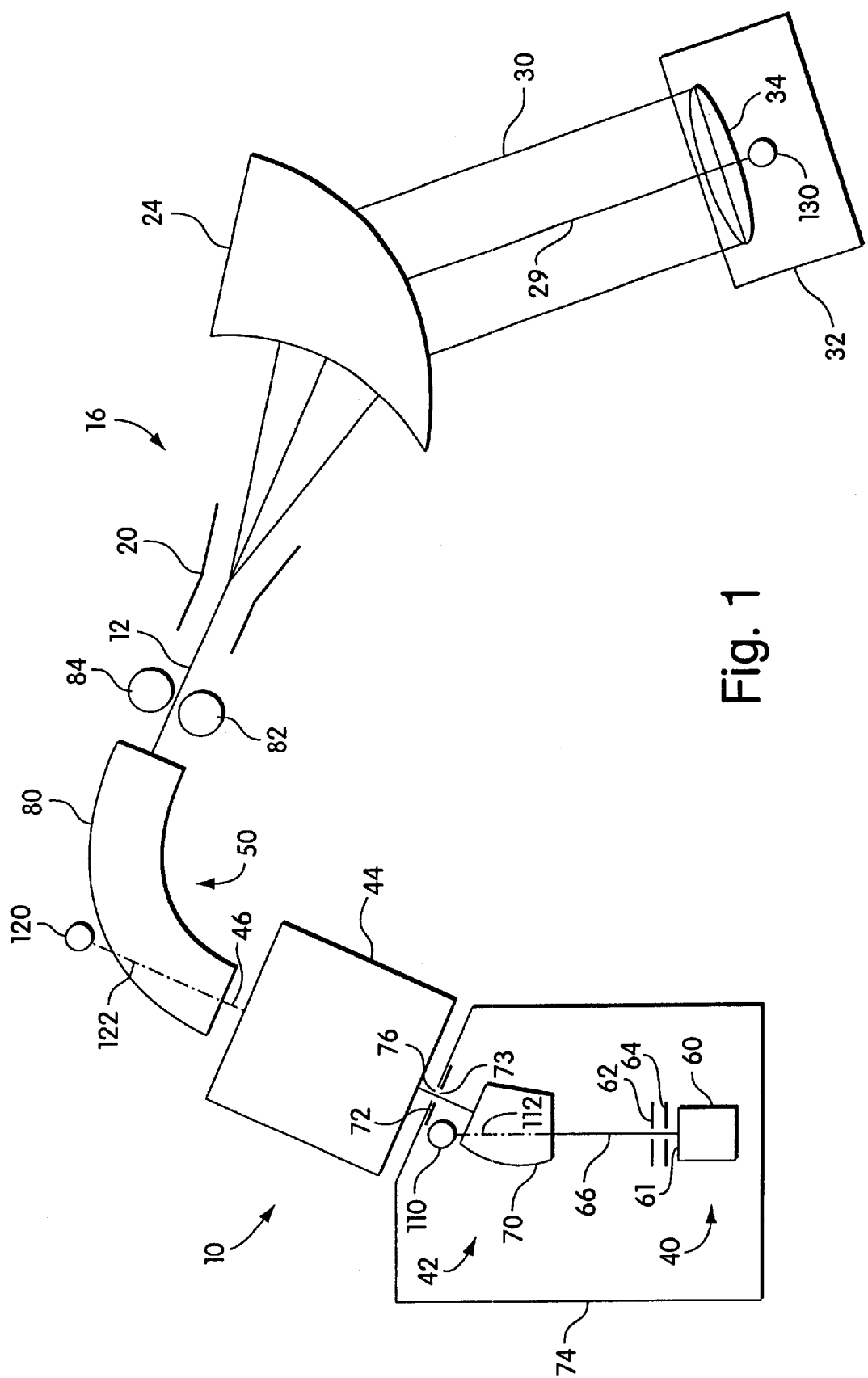
FIG. 1 is a schematic block diagram of an embodiment of an ion implanter in accordance with the present invention.

A simplified block diagram of an embodiment of an ion implanter in accordance with the present invention is shown in FIG. 1. An ion beam generator 10 generates an ion beam of a desired species, accelerates ions in the ion beam to desired energies, performs mass/energy analysis of the ion beam to remove energy and mass contaminants and supplies an energetic ion beam 12 having a low level of energy and mass contaminants. A scanning system 16, which, for example, may include a scanner 20 and an angle corrector 24, deflects the ion beam 12 to produce a scanned ion beam 30. An end station 32 supports a semiconductor wafer 34 or other workpiece in the path of scanned ion beam 30 such that ions of the desired species are implanted into semiconductor wafer 34. The ion implanter may include additional components well known to those skilled in the art. For example, the end station 32 typically includes automated wafer handling equipment for introducing wafers into the ion implanter and for removing wafers after implantation, a dose measuring system, an electron flood gun, etc. It will be understood that the entire path traversed by the ion beam is evacuated during ion implantation.

The principal components of ion beam generator 10 include an ion beam source 40, a source filter 42, an acceleration/deceleration column 44 and a mass analyzer 50. The source filter 42 is preferably positioned in close proximity to ion beam source 40. The acceleration/deceleration column 44 is positioned between source filter 42 and mass analyzer 50.

Ion beam source 40 may include an ion source 60 having an extraction electrode 61, an extraction suppression electrode 64 and a ground electrode 62. Suppression electrode 64 and ground electrode 62 may be movable in X, Y and Z directions. In one implementation of ion beam source 40, the voltage on extraction electrode 61 can be adjusted from 0 to 80 kV, the voltage on suppression electrode 64 can be adjusted from 0 to –40 kV, and ground electrode 62 is at the potential of the terminal. In an example of ion beam source 40, ions from ion source 60 are accelerated to energies of about 0–80 keV by extraction electrode 61. The construction and operation of ion beam sources are well known to those skilled in the art.

The source filter 42 includes a dipole magnet 70 and a mask 72 having a resolving aperture 73. The source filter 42 is housed in a terminal 74 with the ion beam source 40. The terminal 74 is maintained at the potential of ground electrode 62. Dipole magnet 70 is a compact ion optical element which deflects the ion beam through a desired angle, typically 25°, immediately after extraction from ion beam source 40.

Ions of the desired mass and energy are deflected by dipole magnet 70 so as to pass through the resolving aperture 73. Undesired ions with different masses and energies are deflected by different amounts and are intercepted by mask 72. Thus, the source filter 42 passes desired ions and removes undesired ions. The source filter 42 may be set up to ran ions of a desired species and energy by adjusting the current supplied to a magnet coil of dipole magnet 70, so that the desired ions pass through resolving aperture 73.

The acceleration/deceleration column 44 accelerates or decelerates the ions in the ion beam from extraction to final energy and provides an ion beam 46 to mass analyzer 50. When the desired implant energy is less than the extraction voltage, the acceleration/deceleration column 44 decelerates the ion beam.

The mass analyzer 50 includes a dipole analyzing magnet 80 and a mask 82 having a resolving aperture 84. The dipole magnet 80 deflects desired ions in the ion beam by 90°, so that beam 12 passes through resolving aperture 84. Undesired particles are deflected by angles other than 90° and are intercepted by mask 82. The mass analyzer 50, which follows acceleration/deceleration column 44, is at ground potential. The machine optics is designed to bring the beam at final energy to a focus at resolving aperture 84. In a preferred embodiment, the mask 82 may comprise rotating mass slits as disclosed in U.S. Pat. No. 5,629,528 issued May 13, 1997 to Jost et al.

The scanner 20, which may be an electrostatic scanner, deflects ion beam 12 to produce a scanned ion beam having diverging ion trajectories. Angle corrector 24 is designed to deflect ions in the scanned ion beam to produce scanned ion beam 30 having parallel ion trajectories. The construction and operation of ion beam scanners and angle correctors are well known to those skilled in the art.

In accordance with a feature of the invention, the ion implanter is provided with one or more Faraday beam current sensors that are configured for sensing beam position. The current sensors are located in the ion implanter on or adjacent to a desired beam path to permit alignment and/or calibration of the ion implanter. In the example of FIG. 1, a current sensor 110 is positioned adjacent to dipole magnet 70 on a path 112 followed by ion beam 66 when dipole magnet 70 is deenergized. A current sensor 120 is positioned adjacent to analyzing magnet 80 on a path 122 followed by ion beam 46 when analyzing magnet 80 is deenergized. A current sensor 130 is positioned in end station 32 on a path 29 followed by ion beam 30 when scanner 20 is deenergized. It will be understood that more or fewer current sensors may be utilized and that the location of each sensor depends on the nature of the desired measurement or calibration. Furthermore, the ion implanter of FIG. 1 is given by way of example only. The beam current sensors described herein may be utilized for alignment and/or calibration of any ion implanter.

Figure 2:
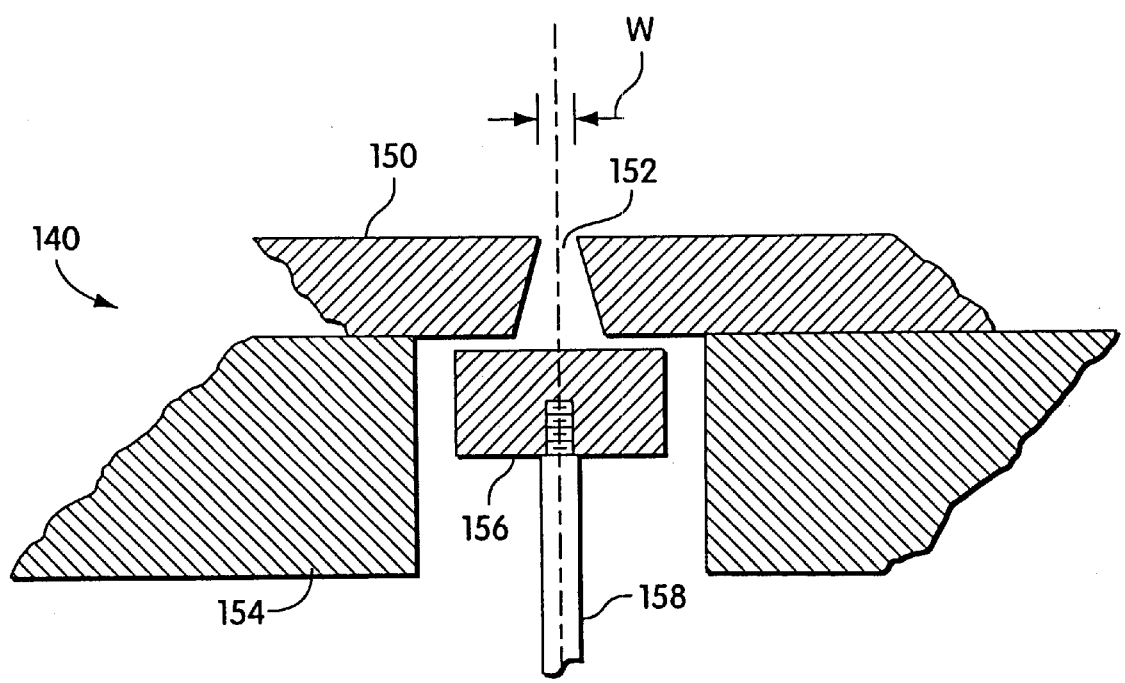
FIG. 2 is a partial cross-sectional diagram of a Faraday beam current sensor suitable for implementation of the present invention.

A simplified cross-sectional diagram of an example of a Faraday beam current sensor 140 suitable for implementing the present invention is shown in FIG. 2. Beam current sensors 110, 120 and 130 (FIG. 1) may have the configuration of beam current sensor 140 shown in FIG. 2. A mask 150 having a sensing aperture 152 may be fabricated of graphite. Mask 150 is mounted on a housing 154, which may be fabricated of aluminum. A current sensing element 156, which may be fabricated of graphite, is located behind aperture 152 and is electrically isolated from mask 150 and housing 154. An electrical lead 158 connects sensing element 156 to sensing circuitry (not shown). The sensing circuitry may be located in proximity to the current sensor or may be located in the main controller of the ion implanter. Aperture 152 preferably has a width W that is small in comparison with the cross-sectional dimension of the ion beam being sensed, thereby permitting sensing of ion beam position relative to the current sensor.

Figure 3:
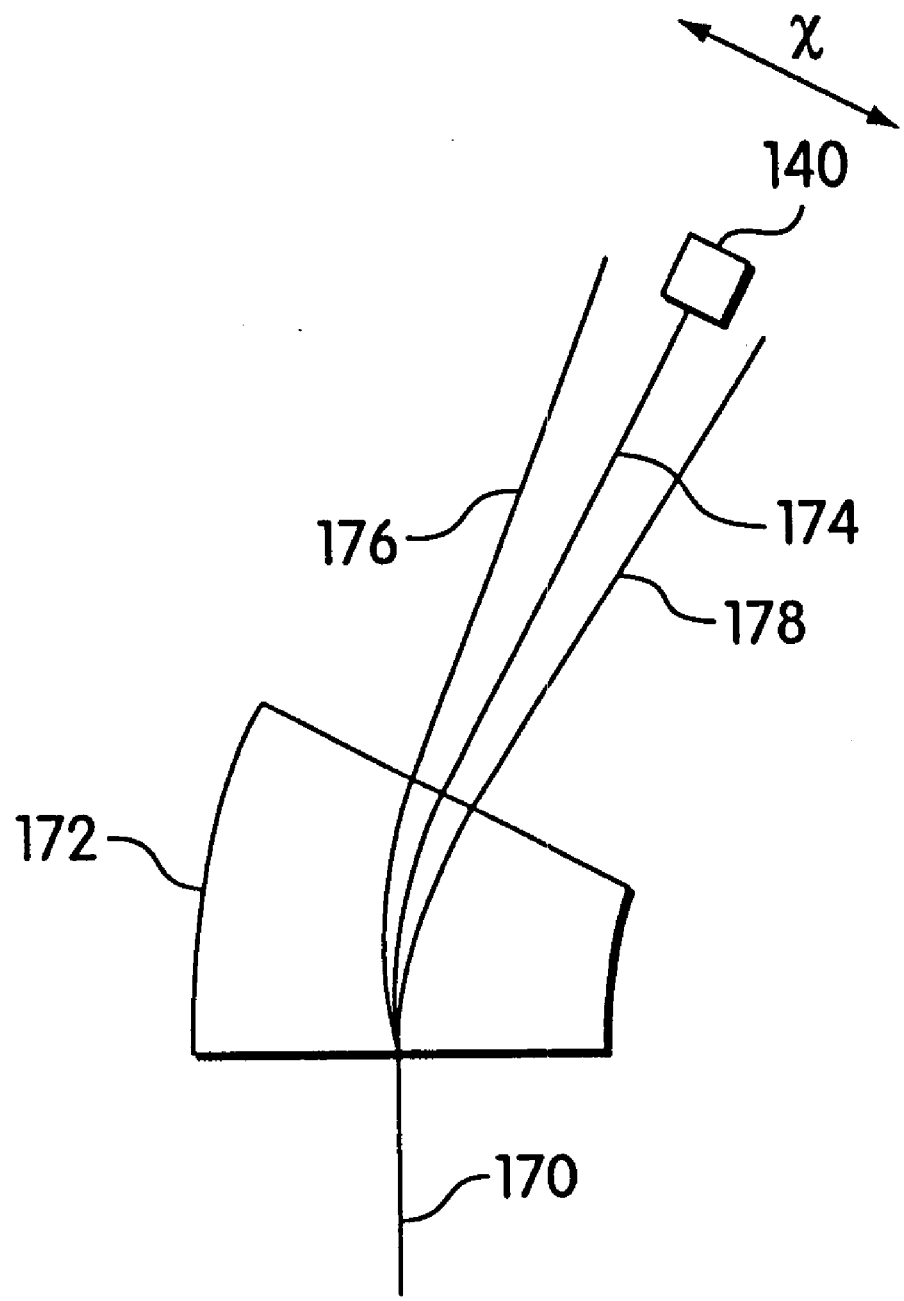
FIG. 3 is a simplified schematic diagram that illustrates deflection of an ion beam relative to a beam current sensor.

The operation of current sensor 140 in determining beam position is described with reference to FIGS. 3 and 4. In FIG. 3, an ion beam 170 is deflected by an ion beam deflection element, such as a dipole magnet 172. The beam deflection element may be any element which alters the path of the ion beam, either by bending or by translation. An ion beam is deflected by an electric field or a magnetic field. The deflection may be changed by varying the electric field or magnetic field. Furthermore, the path of an ion beam may be translated by changing the position of an electrode, such as electrode 62 and/or electrode 64, or other component that affects ion beam position. In the example of FIG. 3, the path of ion beam 170 relative to current sensor 40 may be altered in the plane of FIG. 3 by varying the magnetic field produced by dipole magnet 172. The direction of the magnetic field is perpendicular to the plane of FIG. 3. Thus, one value of magnetic field strength deflects ion beam 170 along a path 174 that is incident on current sensor 140, whereas different magnetic field strengths deflect ion beam 170 along paths 176 and 178 which are not incident on current sensor 140.

Figure 4:
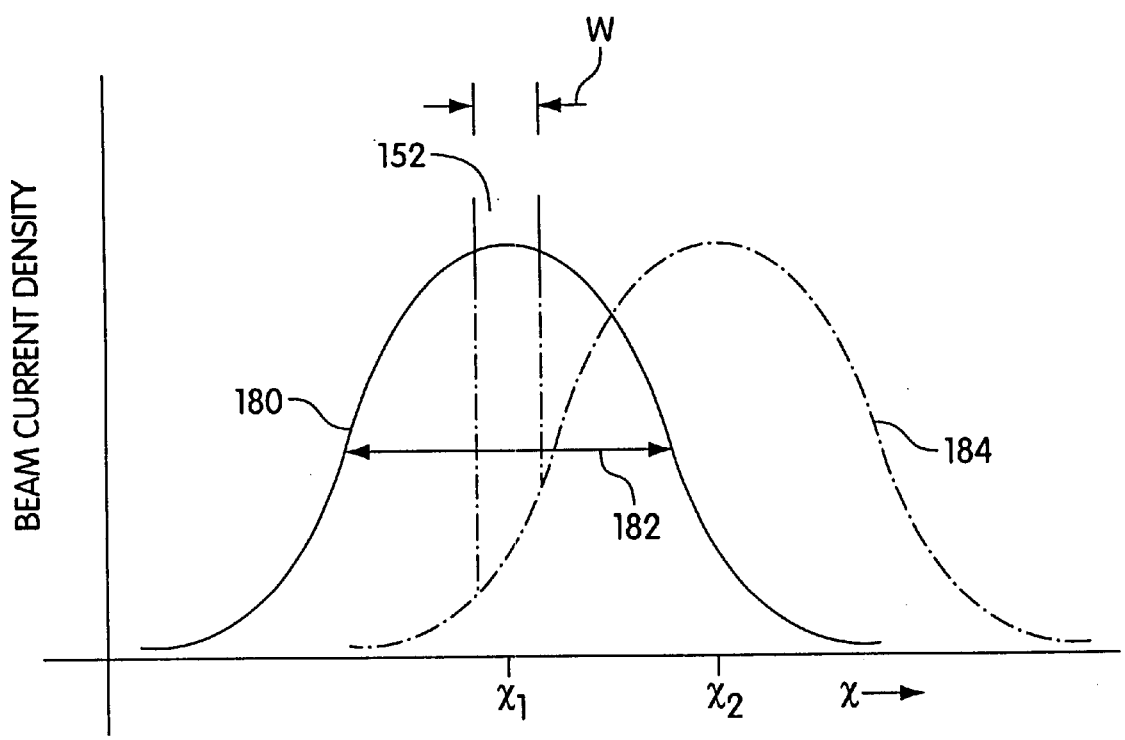
FIG. 4 is a graph of beam current density as a function of distance X transverse to the beam direction, illustrating a sensing aperture of the beam current sensor shown in FIG. 2.

In FIG. 4, beam current density of ion beam 170 is plotted as a function of distance X traverse to the ion beam. Curve 180 represents ion beam 170 at a position $X_1$, and curve 184 represents ion beam 170 at a position $X_2$. The ion beam has a width 182 that varies along the ion beam path from source 40 to wafer 34 (see FIG. 1). Aperture 152 of current sensor 140 having width W is illustrated in FIG. 4. As shown in FIG. 4, the width W of aperture 152 is smaller than the width 182 of the ion beam at the current sensor. This permits the position of the ion beam 170 to be determined relative to current sensor 140. When ion beam 170 is at position $X_1$ represented in FIG. 4 by curve 180, the maximum current density of beam 170 is intercepted by current sensor 140, and a relatively high current value is sensed. When the ion beam 170 is displaced or deflected to position $X_2$, represented by curve 184, a lower value of current density falls within aperture 152, and a lower current value is sensed. Thus, the sensed current value is indicative of beam position relative to current sensor 140. A maximum sensed current value indicates that the ion beam is aligned with the current sensor, whereas lower sensed current values indicate that the ion beam is displaced or deflected relative to the current sensor.

The current sensor 140 can be positioned on the desired beam path. The beam position is then adjusted for maximum sensed current. The beam position can be adjusted, for example, by adjusting the magnetic field or the electric field that deflects the ion beam or by adjusting electrodes that cause the beam to be displaced. Alternatively, the current sensor 140 can be displaced from the desired beam path. In this case, the beam position is adjusted for a desired value of sensed current. Thus, for example, the beam position may be adjusted to provide a sensed current corresponding to beam position $X_2$ in FIG. 4.

For best sensing of ion beam current position, the width W of sensing aperture 152 should be less than 20% of the width 182 of the ion beam being sensed. In one embodiment, the width W of sensing aperture 152 is 0.18 inch for measuring ion beams having widths in a range of one to four inches. The sensed beam current is indicative of beam position, where the width of the sensing aperture is less than the cross-sectional dimension of the ion beam at the sensing aperture.

The current sensor 140 shown in FIG. 2 and described above may be utilized to measure ion beam width. For example, the beam position may be adjusted for maximum sensed current by current sensor 140. The current sensor is then translated in one direction until a desired fraction of the maximum sensed current, such as 50% or 10%, is sensed. The current sensor is then translated in the opposite direction until the same fraction of the maximum sensed current is sensed. The distance traversed by the current sensor between the fractional current values represents the width of the ion beam. If the beam is assumed to be symmetrical about its center, one half of the beam width may be measured. Alternatively, the beam width can be measured by deflecting the ion beam until a desired fraction of the maximum sensed current is sensed. In this case the beam deflection must be known or determinable.

Figure 5A:
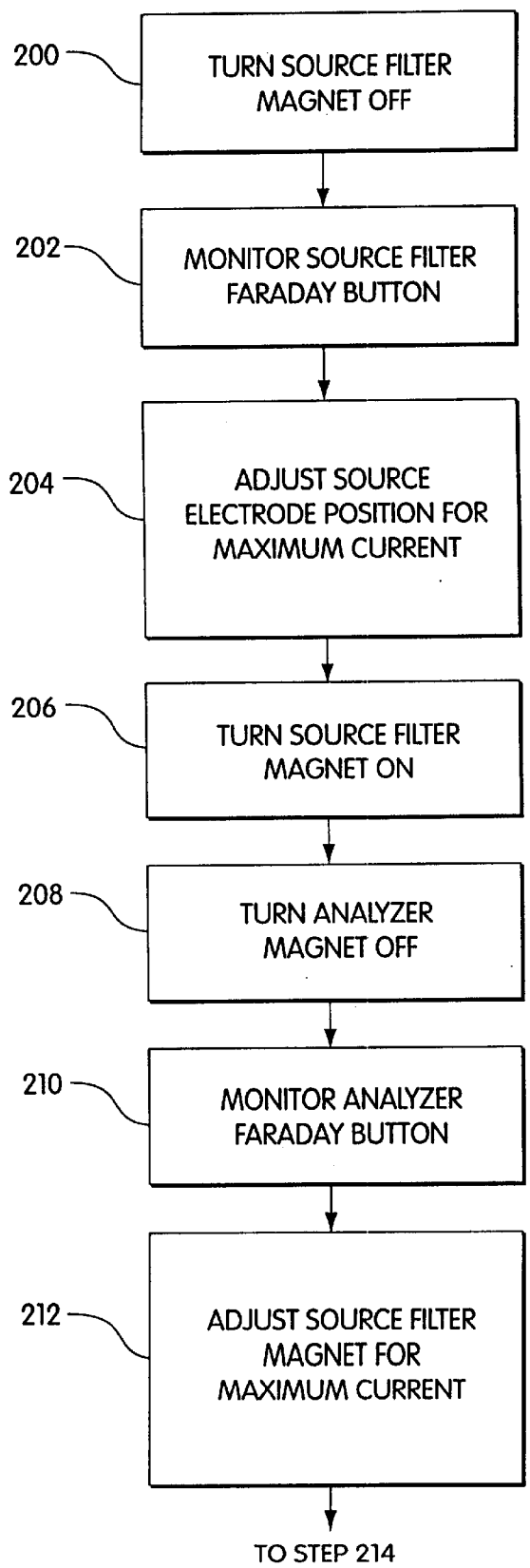
FIGS. 5A and 5B are flow diagrams of an example of a procedure for beam alignment in accordance with the invention.
Figure 5B:
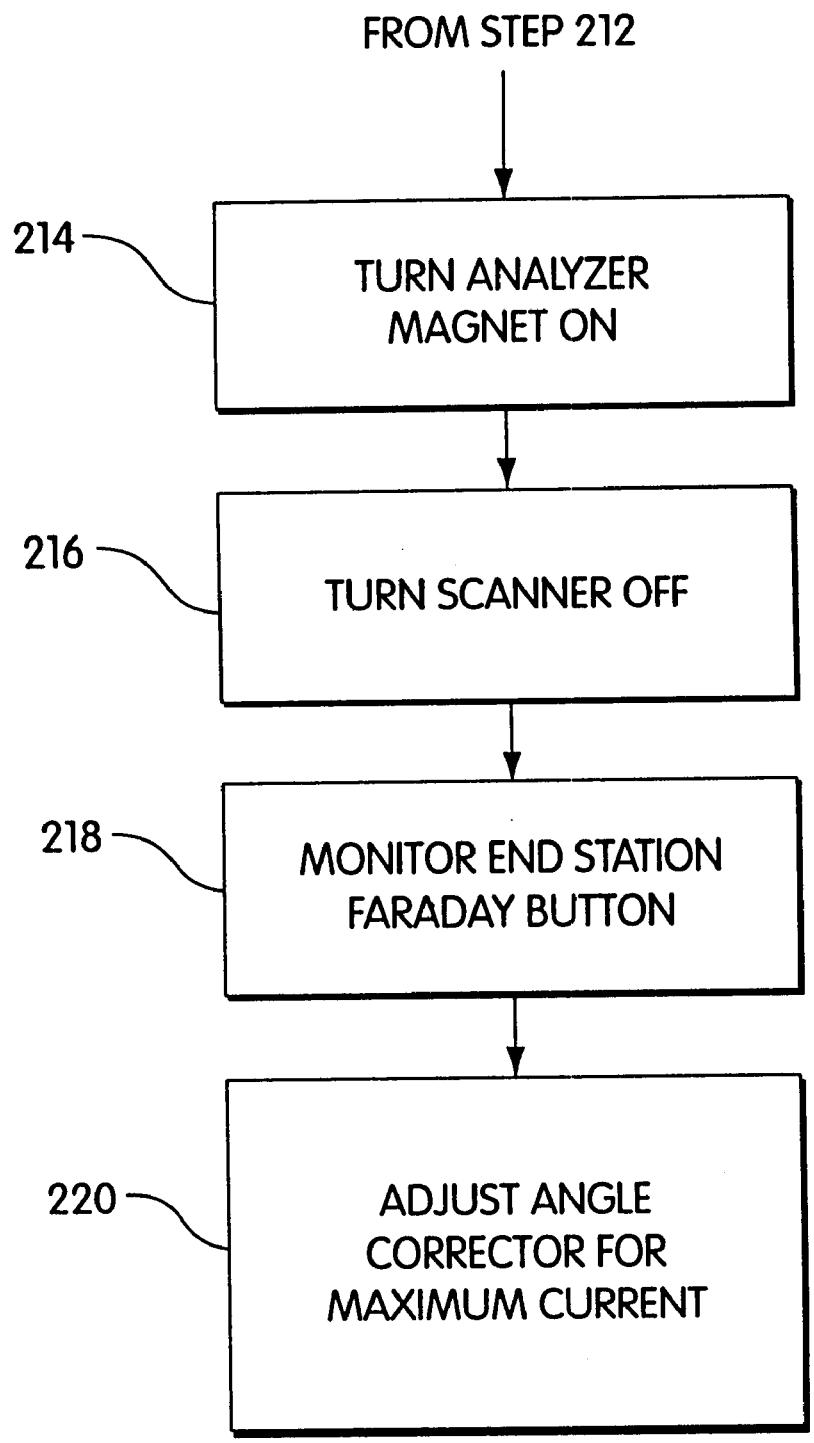

Calibration of the ion implanter shown in FIG. 1 and described above using beam current sensors 110, 120 and 130 is described with reference to the flowchart of FIGS. 5A and 5B. Initially, the source filter dipole magnet 70 is turned off in step 200 by turning off the current supplied to its energizing coils. When dipole magnet 70 is deenergized, ion beam 66 should, if properly aligned, follow straight path 112. In the embodiment of FIG. 1, beam current sensor 110 is positioned in alignment with path 112. In step 202, the current intercepted by current sensor 110 is monitored, and the positions of source electrodes 62 and 64 are adjusted, if necessary, in step 204 for maximum sensed current. As discussed above in connection with FIGS. 3 and 4, maximum sensed current by the current sensor indicates that ion beam 66 is aligned with current sensor 110 and is therefore aligned with desired path 112.

In step 206, source filter dipole magnet 70 is turned on, causing ion beam 66 to be deflected so that it passes through resolving aperture 73 in mask 72 and through acceleration/deceleration column 44. In step 208, analyzing magnet 80 is turned off by turning off the current supplied to its energizing coils. When analyzing magnet 80 is deenergized, ion beam 46 exiting from acceleration/deceleration column 44 should, if properly aligned, follow straight path 122. In step 210, the current from beam current sensor 120 is monitored to determine the position of ion beam 46 relative to current sensor 120. In step 212, source filter dipole magnet 70 is adjusted, if necessary, so as to vary the magnetic field and the resulting deflection of ion beam 46. In particular, dipole magnet 70 is adjusted for maximum sensed current from current sensor 120. This indicates that ion beam 46 is aligned with current sensor 120 and is therefore aligned with desired path 122.

In step 214, analyzer magnet 80 is turned on, causing ion beam 46 to be deflected so that it passes through resolving aperture 84, scanner 20 and angle corrector 24 to end station 32. In step 216, scanner 20 is turned off by turning off the voltage applied between the scanner plates. When scanner 20 is turned off, ion beam 30 exiting from angle corrector 24 should, if properly aligned, follow path 29 shown in FIG. 1. In step 218, the current from beam current sensor 130 in end station 32 is monitored to determine the position of ion beam 30 relative to current sensor 130. In step 220, angle corrector 24 is adjusted, if necessary, so as to vary the magnetic field and the resulting deflection of unscanned ion beam 30. In particular, angle corrector 24 is adjusted for maximum sensed current from current sensor 130. This indicates that the unscanned ion beam 30 is aligned with current sensor 130 and is therefore aligned with path 29.

In addition to the functions described above, the Faraday beam current sensors may be utilized for calibrating system elements that change the position of the ion beam as it passes through the ion implanter. Magnetic elements, such as source filter dipole magnet 70 and analyzing magnet 80, produce beam deflections which are a function of the magnetic field produced by the magnetic element and the characteristics of the ion beam, including the ionic mass, the energy in electron volts and the charge state of the ion beam. Electrostatic elements, such as scanner 20, produce beam deflections which are a function of the electric field produced by the electrostatic element and the characteristics of the ion beam, including the energy in electron volts and the charge state of the ion beam. Thus the path followed by an ion beam through the ion implanter is a function of both the fields produced by the system element and the ion beam characteristics. Since the beam should follow a desired path through the ion implanter to the wafer, it is useful to know the relation between beam characteristics and the parameter of each system element, such as magnetic field or electric field, which changes beam position. These relations permit the system elements to be set in advance for given beam characteristics, so that the ion beam follows the desired path through the ion implanter.

The relation between a characteristic, X, of the ion beam and a parameter, Y, of the system element required to direct the ion beam along the desired path through the ion implanter may be expressed as Y=f(X). In a simple case where the relation between the characteristic, X, of the ion beam and the parameter, Y, of the system element is linear, the functional relationship may be determined by measuring two sets of values $(X_1, Y_1)$ and $(X_2, Y_2)$ required to direct the ion beam along the desired ion beam path. In the more general case where the relation Y=f(X) is a polynomial of order n, the functional relationship may be determined by measuring n+1 sets of values $(X_n, Y_n)$. The relation Y=f(x) may be utilized to set the required parameter Y of the system element so as to direct an ion beam of characteristic X along the desired beam path.

In a magnetic field, an ion follows a path determined by its magnetic rigidity, which is a function of the ionic mass, energy in electron volts and charge state. As described above, an ion implanter is utilized to implant species with different ionic masses, different energies and different charge states. Ion beams with different parameters have different magnetic rigidities, and readjustment of the ion implanter is required when the species, energy or charge of the ion beam is changed. In particular, the magnetic field produced by a magnetic system element must be readjusted so that an ion beam having a given magnetic rigidity follows the desired path through the implanter. It is desirable to provide a calibration between magnetic rigidity of the ion beam, a known quantity for a particular ion beam, and the magnetic field required to deflect the ion beam along the desired path through the implanter. The required magnetic field, B, is a function of the magnetic rigidity, R, in general as follows.

$$B = \sum_{i=0}^{n} a_n R^n \tag{1}$$

where $a_n$ are constants that depend on implanter geometry. Values of $a_n$ are fixed for a particular ion implanter. In a simple case, the magnetic field, B, may be expressed as a linear function of magnetic rigidity, R:

$$B = a_1 R + a_0 \tag{2}$$

Thus, equation (1) is reduced from a polynomial of order n to a linear function in equation (2).

Figure 6:
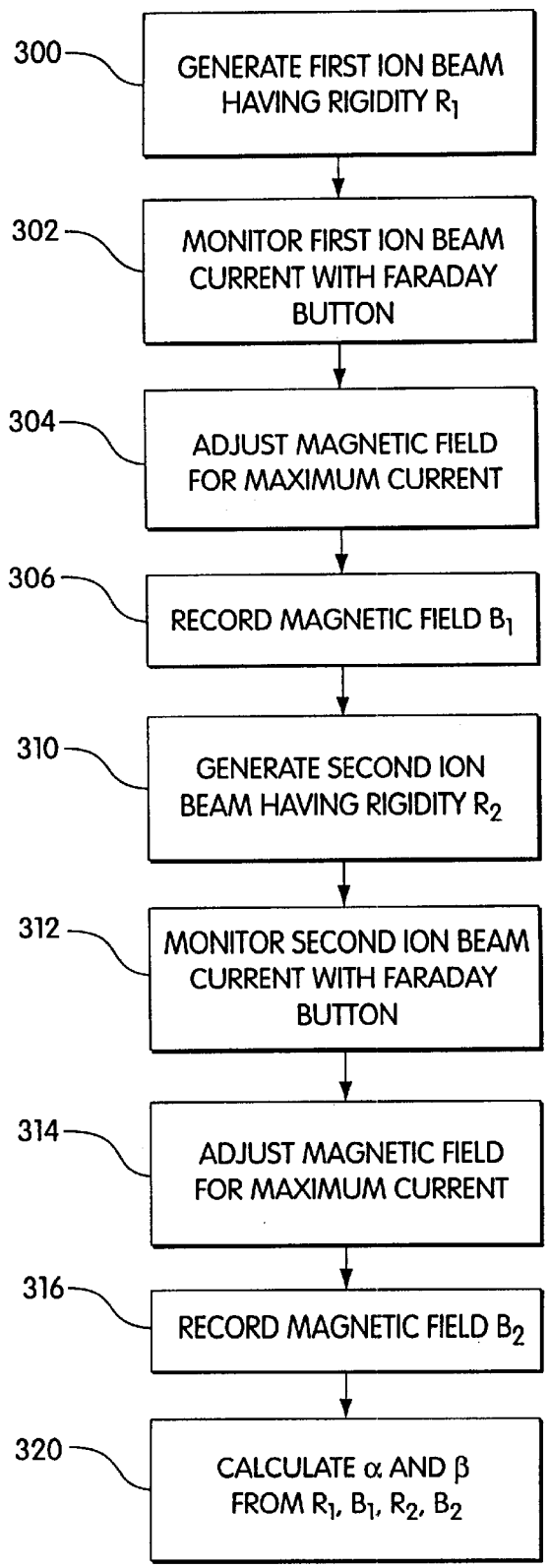
FIG. 6 is a flow diagram of an example of a procedure for calibration of a magnetic element in accordance with the invention.

The beam current sensor 120 may be used to calibrate dipole magnet 70 for different ion beams and, in particular, may be used to determine the values of $a_0$ and $a_1$ in equation (2). The process for determining the values of $a_0$ and $a_1$ is shown in the flowchart of FIG. 6. In step 300, a first ion beam having a first magnetic rigidity $R_1$ is generated by ion source 40. As stated above, the magnetic rigidity $R_1$ is a function of the energy, ionic mass and charge state of the ion beam. The ion beam current produced by the first ion beam is monitored with beam current sensor 120 in step 302. The magnetic field B in the gap between the poles of dipole magnet 70 is adjusted, if necessary, in step 304 for maximum sensed current by current sensor 120. The magnetic field $B_1$ corresponding to the maximum sensed current by current sensor 120 is recorded in step 306. The magnetic field $B_1$ is the field required to deflect an ion beam of magnetic rigidity $R_1$ along desired path 122. The magnetic field $B_1$ is known from calibration of dipole magnet 70. Thus, magnetic field $B_1$ corresponds to a known dipole magnet current.

In step 310, a second ion beam having a second magnetic rigidity $R_2$ different from magnetic rigidity $R_1$ is generated. In step 312, the second ion beam is monitored with beam current sensor 120, and the magnetic field produced by dipole magnet 70 is adjusted, if necessary, in step 314 for maximum sensed current by current sensor 120. The magnetic field that produces maximum sensed current by beam current sensor 120 is the magnetic field $B_2$ required to direct an ion beam of magnetic rigidity $R_2$ along desired path 122. Magnetic field $B_2$ is recorded in step 316. From the values determined in steps 300–316, the following equations may be written:

$$B_1 = a_1 R_1 + a_0 \quad (3)$$

$$B_2 = a_1 R_2 + a_0 \quad (4)$$

Since the values of $R_1$, $B_1$, $R_2$ and $B_2$ are known, the values of $a_0$ and $a_1$ can be calculated from equations (3) and (4) in step 320. Equation (2) can then be utilized to quickly and efficiently set the required magnetic field B produced by dipole magnet 70 so as to direct an ion beam of magnetic rigidity R along desired path 122. The beam current sensor 120 is thereby utilized to calibrate a dipole magnet.

The above process determines constants $a_0$ and $a_1$ for the linear relationship of equation (2). In the more general case of equation (1), a set of n constants may be determined by repeating the above steps for a set of n+1 ion beams having different magnetic rigidities.

It will be understood that the process shown in FIG. 6 and described above may be utilized to calibrate angle corrector magnet 24 in the same manner. In this case, beam current sensor 130 is utilized to determine beam position, and the magnetic field produced by angle corrector 24 is adjusted for maximum sensed current using two or more different ion beams.

The process described above also may be utilized for calibration of electrostatic elements, such as electrostatic scanners. The electric field required for producing a desired deflection of the ion beam may be expressed as a polynomial function of the charge state and the energy of the ion beam. Two or more different ion beams are run through the ion implanter, so as to determine the constants in the relation between the beam characteristics and the electric field as described above in connection with magnetic elements. The resulting relation can then be utilized to quickly and efficiently set the required electric field produced by the electrostatic element so as to direct an ion beam of given charge state and energy along the desired beam path.

While there have been shown and described what are at present considered the preferred embodiments of the present invention, it will be obvious to those skilled in the art that various changes and modifications may be made therein without departing from the scope of the invention as defined by the appended claims.

What is claimed is:

1. A method for sensing an ion beam, comprising the steps of:
   generating an ion beam and directing the ion beam along a beamline; and
   sensing the ion beam with a beam current sensor positioned on or adjacent to the beamline, said beam current sensor having a sensing aperture that is smaller than a cross-sectional dimension of the ion beam at the beam current sensor, wherein the sensed ion beam current is indicative of ion beam position relative to a desired ion beam path.

2. A method as defined in claim 1 further comprising the step of adjusting the ion beam position if the sensed ion beam position differs from the desired ion beam path.

3. A method as defined in claim 2 wherein the step of adjusting the ion beam position comprises adjusting the ion beam position for maximum sensed ion beam current.

4. A method as defined in claim 2 further comprising the step of applying a magnetic field to the ion beam, wherein the step of adjusting the ion beam position comprises adjusting the magnetic field applied to the ion beam.

5. A method as defined in claim 4 further comprising the step of determining the magnetic field required to direct the ion beam along the desired ion beam path.

6. A method as defined in claim 2 further comprising the step of applying an electric field to the ion beam, wherein the step of adjusting the ion beam position comprises adjusting the electric field applied to the ion beam.

7. A method as defined in claim 2 wherein the ion beam is generated in an ion source having a movable electrode and wherein the step of adjusting the ion beam position comprises adjusting a position of the movable electrode.

8. A method as defined in claim 1 wherein the step of sensing the ion beam comprises:
   sensing the ion beam with a plurality of beam current sensors located at different positions on or adjacent to the beamline, each of said beam current sensors having a sensing aperture that is smaller than a cross-sectional dimension of the ion beam at the respective current sensor, wherein the ion beam current sensed by each of said beam current sensors is indicative of ion beam position relative to the desired ion beam path.

9. A method as defined in claim 1 wherein a system element changes the position of an ion beam with respect to the desired ion beam path depending on a parameter Y of the system element and a characteristic X of the ion beam, further comprising the step of determining, using the beam current sensor, a relation Y=f(X) between the characteristic X of the ion beam and the parameter Y of the system element that is required to direct the ion beam along the desired ion beam path.

10. A method as defined in claim 9 wherein the characteristic X comprises the magnetic rigidity of the ion beam and wherein the parameter Y of the system element comprises the magnetic field produced by the system element.

11. A method as defined in claim 9 wherein the characteristic X comprises the energy and the charge state of the ion beam and wherein the parameter Y of the system element comprises the electric field produced by the system element.

12. A method as defined in claim 9 wherein the step of determining the relation Y=f(X) comprises measuring two or more sets of values of the characteristic X and the parameter Y required to direct the ion beam along the desired ion beam path.

13. A method as defined in claim 9 wherein parameter Y is a linear function of the characteristic X and wherein the step of determining the relation Y=f(X) comprises measuring two sets of values $(X_1, Y_1)$ and $(X_2, Y_2)$ required to direct the ion beam along the desired ion beam path.

14. A method as defined in claim 9 wherein the relation Y=f(X) is polynomial of order n and wherein the step of determining the relation Y=f(X) comprises measuring n+1 sets of values $(X_n, Y_n)$ required to direct the ion beam along the desired ion beam path.

15. A method as defined in claim 1 further comprising the steps of:
   using the beam current sensor to determine a first magnetic field $B_1$ required to direct a first ion beam having a first magnetic rigidity $R_1$ along the desired ion beam path;
   using the beam current sensor to determine a second magnetic field $B_2$ required to direct a second ion beam having a second magnetic rigidity $R_2$ along the desired ion beam path; and from the values of $B_1$, $B_2$, $R_1$, and $R_2$, calculating values of $a_0$ and $a_1$ in the equation:

$$B=a_1R+a_0$$

thereby providing a relation between magnetic rigidity R of an ion beam and magnetic field B.

16. A method as defined in claim 15 wherein the steps of determining a first magnetic field $B_1$ and determining a second magnetic field $B_2$ each comprises the steps of:

generating an ion beam;

sensing the position of the ion beam with the beam current sensor;

adjusting the magnetic field applied to the ion beam until the beam current sensor indicates that the ion beam is directed along the desired path; and recording the value of magnetic field required to direct the ion beam along the desired path.

17. A method as defined in claim 16 wherein the step of adjusting the magnetic field includes adjusting the magnetic field for maximum sensed current.

18. A method as defined in claim 1 further comprising the step of translating the beam current sensor relative to the ion beam in a direction transverse to the ion beam, wherein the sensed ion beam current is indicative of ion beam size in the transverse direction.

19. A method as defined in claim 18 wherein the step of translating the beam current sensor relative to the ion beam comprises translating the beam current sensor relative to a fixed ion beam.

20. A method as defined in claim 18 wherein the step of translating the beam current sensor relative to the ion beam comprises deflecting the ion beam relative to a fixed beam current sensor.

21. An ion implanter comprising:

an ion source for generating an ion beam and for directing the ion beam along a beamline toward a target position;

an ion beam deflection element disposed along said beamline for deflecting said ion beam relative to said beamline;

a beam current sensor positioned on or adjacent to said beamline for sensing ion beam current, said beam current sensor having a sensing aperture that is smaller than a cross-sectional dimension of the ion beam at said current sensor, wherein the sensed ion beam current is indicative of ion beam position relative to a desired ion beam path; and means for adjusting said ion beam deflection element, in response to the sensed ion beam position, so that said ion beam is directed along the desired ion beam path.

22. An ion implanter as defined in claim 21 wherein said ion beam deflection element comprises a magnetic deflection element for applying a magnetic field to the ion beam and wherein said means for adjusting said ion beam deflection element comprises means for adjusting the magnetic field applied to the ion beam by said deflection element.

23. An ion implanter as defined in claim 21 wherein said beam current sensor comprises a plurality of beam current sensors located at different positions on or adjacent to the beamline, each of said beam current sensors having a sensing aperture that is smaller than a cross-sectional dimension of the ion beam at the respective current sensor, wherein the ion beam current sensed by each of said beam current sensors is indicative of ion beam position relative to the desired ion beam path.

24. An ion implanter as defined in claim 21 wherein said ion beam deflection element changes the position of said ion beam with respect to the desired ion beam path depending on a parameter Y of the deflection element and a characteristic X of the ion beam, said apparatus further comprising means, using the beam current sensor, for determining a relation Y=f(X) between the characteristic X of the ion beam and the parameter Y of the deflection element that is required direct to the ion beam along the desired ion beam path.

25. An ion implanter as defined in claim 24 wherein said deflection element comprises a magnetic element, wherein the characteristic X comprises the magnetic rigidity of the ion beam and wherein the parameter Y comprises the magnetic field produced by the magnetic element.

26. An ion implanter as defined in claim 24 wherein said deflection element comprises an electrostatic element, wherein the characteristic X comprises the beam energy and charge state of the ion beam and wherein the parameter Y comprises the electric field produced by the electrostatic element.

27. An ion implanter as defined in claim 21 further comprising:

means for using the beam current sensor to determine a first magnetic field $B_1$ required to direct a first ion beam having a first magnetic rigidity $R_1$ along the desired ion beam path;

means for using the beam current sensor to determine a second magnetic field $B_2$ required to direct a second ion beam having a second magnetic rigidity $R_2$ along the desired ion beam path; and means for calculating values of $a_0$ and $a_1$ from the values $B_1$, $B_2$, $R_1$, and $R_2$ in the equation:

$$B=a_1R+a_0$$

thereby providing a relation between magnetic rigidity R of an ion beam and magnetic field B for the ion implanter.

28. A method for determining a relation between magnetic rigidity R of an ion beam and magnetic field B required to direct the ion beam along a desired path in an ion implanter, comprising the steps of:

positioning a beam current sensor on or adjacent to the desired path, said beam current sensor having a sensing aperture that is smaller than a cross-sectional dimension of the ion beam at the beam current sensor;

using the beam current sensor to determine a first magnetic field $B_1$ required to direct a first ion beam having a first magnetic rigidity $R_1$ along the desired path;

using the beam current sensor to determine a second magnetic field $B_2$ required to direct a second ion beam having a second magnetic rigidity $R_2$ along the desired path; and from the values of $B_1$, $B_2$, $R_1$ and $R_2$, calculating values of $a_0$ and $a_1$ in the equation:

$$B=a_1R+a_0$$

thereby providing a relation between magnetic rigidity R of an ion beam and magnetic field B for the ion implanter.

29. In an ion beam system wherein a system element changes the position of an ion beam with respect to an ion beam path depending on a parameter Y of the system element and a characteristic X of the ion beam, a method for calibrating the system element comprising the steps of:

positioning a beam current sensor on or adjacent to the ion beam path, said beam current sensor having a sensing aperture that is smaller than a cross-sectional dimension of the ion beam at the beam current sensor; and using the beam current sensor, determining a relation $Y=f(X)$ between the characteristic X of the ion beam and the parameter Y of the system element that is required to direct the ion beam along the ion beam path.

30. A method as defined in claim 29 wherein the characteristic X comprises the magnetic rigidity of the ion beam and wherein the parameter Y comprises the magnetic field produced by the system element.

31. A method as defined in claim 29 wherein the characteristic X comprises the energy and the charge state of the ion beam and wherein the parameter Y comprises the electric field produced by the system element.

32. A method as defined in claim 29 wherein the step of determining the relation $Y=f(X)$ comprises the step of measuring two or more sets of values of the characteristic X and the parameter Y required to direct the ion beam along the desired ion beam path.

33. A method as defined in claim 29 wherein parameter Y is a linear function of the characteristic X and wherein the step of determining the relation $Y=f(X)$ comprises measuring two sets of values $(X_1, Y_1)$ and $(X_2, Y_2)$ required to direct the ion beam along the desired ion beam path.

34. A method as defined in claim 29 wherein the relation $Y=f(X)$ is polynomial of order n and wherein the step of determining the relation $Y=f(X)$ comprises the step of measuring n+1 sets of values $(X_n, Y_n)$ required to direct the ion beam along the desired ion beam path.

\* \* \* \* \*